United States Patent
Jen (10) Patent No.: US 8,253,460 B2
(45) Date of Patent: Aug. 28, 2012

(54) OSCILLATION CIRCUIT, TIMING DEVICE, AND ELECTRONIC SYSTEM UTILIZING THE SAME

(75) Inventor: Ming Jen, Hsinchu (TW)

(73) Assignee: Princeton Technology Corporation, Hsin Tien, Taipei County (TW)

( * ) Notice: Subject to any disclaimer, the term of this patent is extended or adjusted under 35 U.S.C. 154(b) by 207 days.

(21) Appl. No.: 12/779,524

(22) Filed: May 13, 2010

(65) Prior Publication Data
US 2010/0289545 A1 Nov. 18, 2010

(30) Foreign Application Priority Data
May 14, 2009 (TW) .............................. 98115978 A (51) Int. Cl.
*H03L 7/00* (2006.01)
(52) U.S. Cl. ........................................ 327/160; 331/57
(58) Field of Classification Search .................... None
See application file for complete search history.

(56) References Cited

U.S. PATENT DOCUMENTS

| | | | |
|---|---|---|---|
| 5,208,558 A * | 5/1993 | Shigehara et al. | 331/116 FE |
| 6,522,205 B2 * | 2/2003 | Kallio et al. | 331/1 R |
| 7,042,299 B2 * | 5/2006 | Tachibana et al. | 331/158 |
| 7,301,377 B2 * | 11/2007 | Tanaka et al. | 327/113 |
| 7,598,821 B2 * | 10/2009 | Novac | 331/160 |
| 2002/0121940 A1 * | 9/2002 | Chrissostomidis et al. | 331/36 C |
| 2005/0002316 A1 * | 1/2005 | Maruyama | 369/116 |
| 2008/0061894 A1 * | 3/2008 | Raita et al. | 331/57 |

* cited by examiner

*Primary Examiner* — Cassandra Cox
(74) *Attorney, Agent, or Firm* — Muncy, Geissler, Olds & Lowe, PLLC (57) ABSTRACT

An oscillation circuit including a first transistor, a second transistor, a current source, a first inverter, and an impedance unit is disclosed. The first transistor has a first source receiving a first operation voltage, a first drain, and a first gate coupled to the first drain. The second transistor has a second source receiving the first operation voltage, a second drain, and a second gate coupled to the first gate. The current source is coupled between the first drain and a grounding voltage. The first inverter generates an oscillation signal and has a first input terminal, a first output terminal, and a first power terminal coupled to the second drain. The impedance unit is coupled between the first input terminal and the first output terminal.

16 Claims, 8 Drawing Sheets

OSCILLATION CIRCUIT, TIMING DEVICE, AND ELECTRONIC SYSTEM UTILIZING THE SAME

CROSS REFERENCE TO RELATED APPLICATIONS

This Application claims priority of Taiwan Patent Application No. 98115978, filed on May 14, 2009, the entirety of which is incorporated by reference herein.

BACKGROUND OF THE INVENTION

1. Field of the Invention

The invention relates to an oscillation circuit, and more particularly to an oscillation circuit having low power consumption.

2. Description of the Related Art

In general, oscillation circuits comprise a real time clock (RTC). The time of the RTC is updated according to an oscillation signal generated by the oscillation circuit. Generally, the oscillation circuit includes an inverter to generate the oscillation signal. When an operation voltage is provided to the inverter, the inverter starts generating the oscillation signal. However, the power consumption of the oscillation circuit is increased when operation voltage thereof is changed due to a power supply or changes in environment temperature. Furthermore, a direct current (DC) work point of the inverter shifts, when operation voltage of the oscillation circuit is changed.

BRIEF SUMMARY OF THE INVENTION

Oscillation circuits are provided. An exemplary embodiment of an oscillation circuit includes a first transistor, a second transistor, a current source, a first inverter, and an impedance unit. The first transistor has a first source receiving a first operation voltage, a first drain, and a first gate coupled to the first drain. The second transistor has a second source receiving the first operation voltage, a second drain, and a second gate coupled to the first gate. The current source is coupled between the first drain and a grounding voltage. The first inverter generates an oscillation signal and has a first input terminal, a first output terminal, and a first power terminal coupled to the second drain. The impedance unit is coupled between the first input terminal and the first output terminal.

Timing devices are provided. An exemplary embodiment of a timing device includes a logic circuit and an oscillation circuit. The logic circuit counts the pulse amount of an oscillation signal and updates time of a real time clock (RTC) according to the counting result. The oscillation circuit is coupled to the logic circuit and includes a first transistor, a second transistor, a current source, a first inverter, and an impedance unit. The first transistor has a first source receiving a first operation voltage, a first drain, and a first gate coupled to the first drain. The second transistor has a second source receiving the first operation voltage, a second drain, and a second gate coupled to the first gate. The current source is coupled between the first drain and a grounding voltage. The first inverter generates an oscillation signal and has a first input terminal, a first output terminal, and a first power terminal coupled to the second drain. The impedance unit is coupled between the first input terminal and the first output terminal.

Electronic systems are also provided. An exemplary embodiment of an electronic system comprises a real time clock and a timing device. The timing device controls the real time clock and includes a logic circuit and an oscillation circuit. The logic circuit counts the pulse amount of an oscillation signal and updates the time of the real time clock according to the counting result. The oscillation circuit includes a first transistor, a second transistor, a current source, a first inverter, and an impedance unit. The first transistor has a first source receiving a first operation voltage, a first drain, and a first gate coupled to the first drain. The second transistor has a second source receiving the first operation voltage, a second drain, and a second gate coupled to the first gate. The current source is coupled between the first drain and a grounding voltage. The first inverter generates an oscillation signal and has a first input terminal, a first output terminal, and a first power terminal coupled to the second drain. The impedance unit is coupled between the first input terminal and the first output terminal.

A detailed description is given in the following embodiments with reference to the accompanying drawings.

BRIEF DESCRIPTION OF THE DRAWINGS

The invention can be more fully understood by referring to the following detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1:
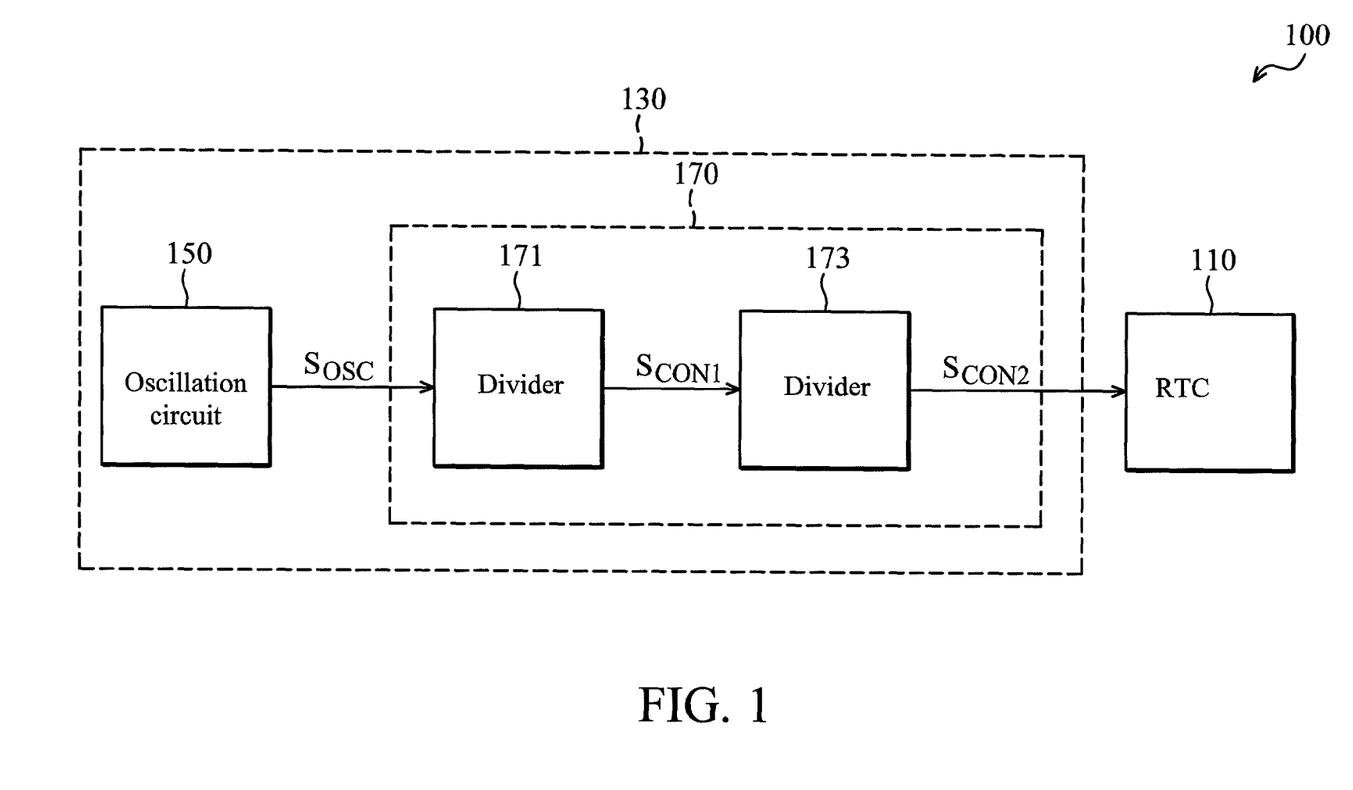
FIG. 1 is a schematic diagram of an exemplary embodiment of an electronic system of the invention.

FIG. 1 is a schematic diagram of an exemplary embodiment of an electronic system. The electronic system 100 includes a real time clock (RTC) 110 and a timing device 130. The timing device 130 controls the time of the RTC 110. In this embodiment, the timing device 130 includes an oscillation circuit 150 and a logic circuit 170. The oscillation circuit 150 is coupled to the logic circuit 170 and generates an oscillation signal $S_{OSC}$. The logic circuit 170 counts the pulse of the oscillation signal $S_{OSC}$ to obtain the pulse amount of the oscillation signal $S_{OSC}$ and updates the time of the RTC 110 according to the counting result (i.e. the pulse amount).

In this embodiment, the logic circuit 170 includes dividers 171 and 173, but the disclosure is not limited thereto. As shown in FIG. 1, the pulse amount of the processed signal $S_{CON2}$ generated by the divider 173 determines the time of the RTC 110.

The divider 171 of the logic circuit 170 processes the oscillation signal $S_{OSC}$ to generate a processed signal $S_{CON1}$. The divider 173 processes the processed signal $S_{CON1}$ to generate another processed signal $S_{CON2}$. In this embodiment, the factors of the dividers 171 and 173 are equal to 2 (i.e. the dividers 171 and 173 are frequency dividers-by-2).

Thus, the pulse amount of the processed signal $S_{CON1}$ is a half of the pulse amount of the oscillation signal $S_{OSC}$ and the pulse amount of the processed signal $S_{CON2}$ is a half of the pulse amount of the processed signal $S_{CON1}$.

The factor of the divider is not limited. In other embodiments, the factor of the divider can be any value. Further, the number of dividers is not limited. In one embodiment, the number of dividers of the logic circuit 170 exceeds 2.

Figure 2A:
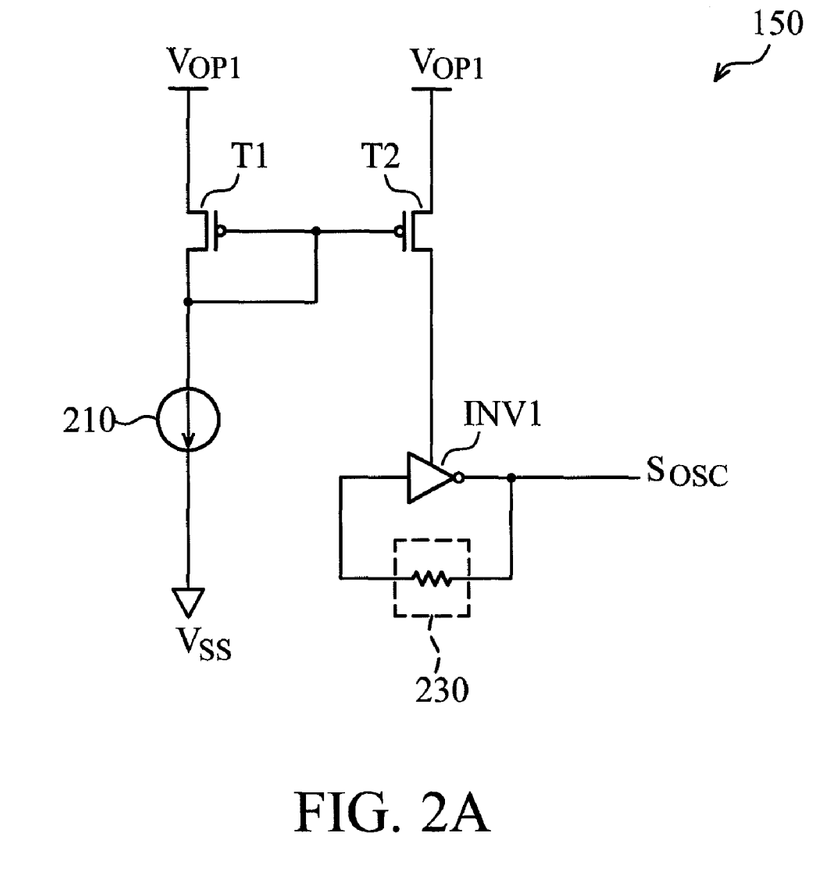
FIG. 2A is a schematic diagram of an exemplary embodiment of an oscillation circuit.

FIG. 2A is a schematic diagram of an exemplary embodiment of an oscillation circuit. The oscillation circuit 150 includes transistors T1, T2, a current source 210, an inverter INV1, and an impedance unit 230. In this embodiment, the transistors T1 and T2 are PMOS transistors, but the disclosure is not limited thereto. In some embodiments, the transistors T1 and T2 can be replaced by NOMS transistors. Since the method for replacement between PMOS and NMOS transistors is well known to those skilled in the art, description thereof is omitted.

The transistor T1 has a source receiving an operation voltage $V_{OP1}$, a drain coupled to the current source 210, and a gate coupled to the drain. The transistor T2 has a source receiving the operation voltage $V_{OP1}$, a drain coupled to the power terminal of the inverter INV1, and a gate coupled to the gate of the transistor T1. The current source 210 is coupled between the drain of the transistor T1 and the grounding voltage $V_{SS}$ for providing a fixed current. The inverter INV1 is connected to the impedance unit 230 in parallel and generates the oscillation signal $S_{OSC}$. In this embodiment, the impedance unit 230 is a resistor. In some embodiments, those skilled in the art can utilize other elements to embody the impedance unit 230.

Since the oscillation circuit 150 includes the current source 210, the current passing through the power terminal of the inverter INV1 can be maintained in a fixed range. Thus, the power consumption of the inverter INV1 is not increased when the operation voltage $V_{OP1}$ is changed.

Figure 2B:
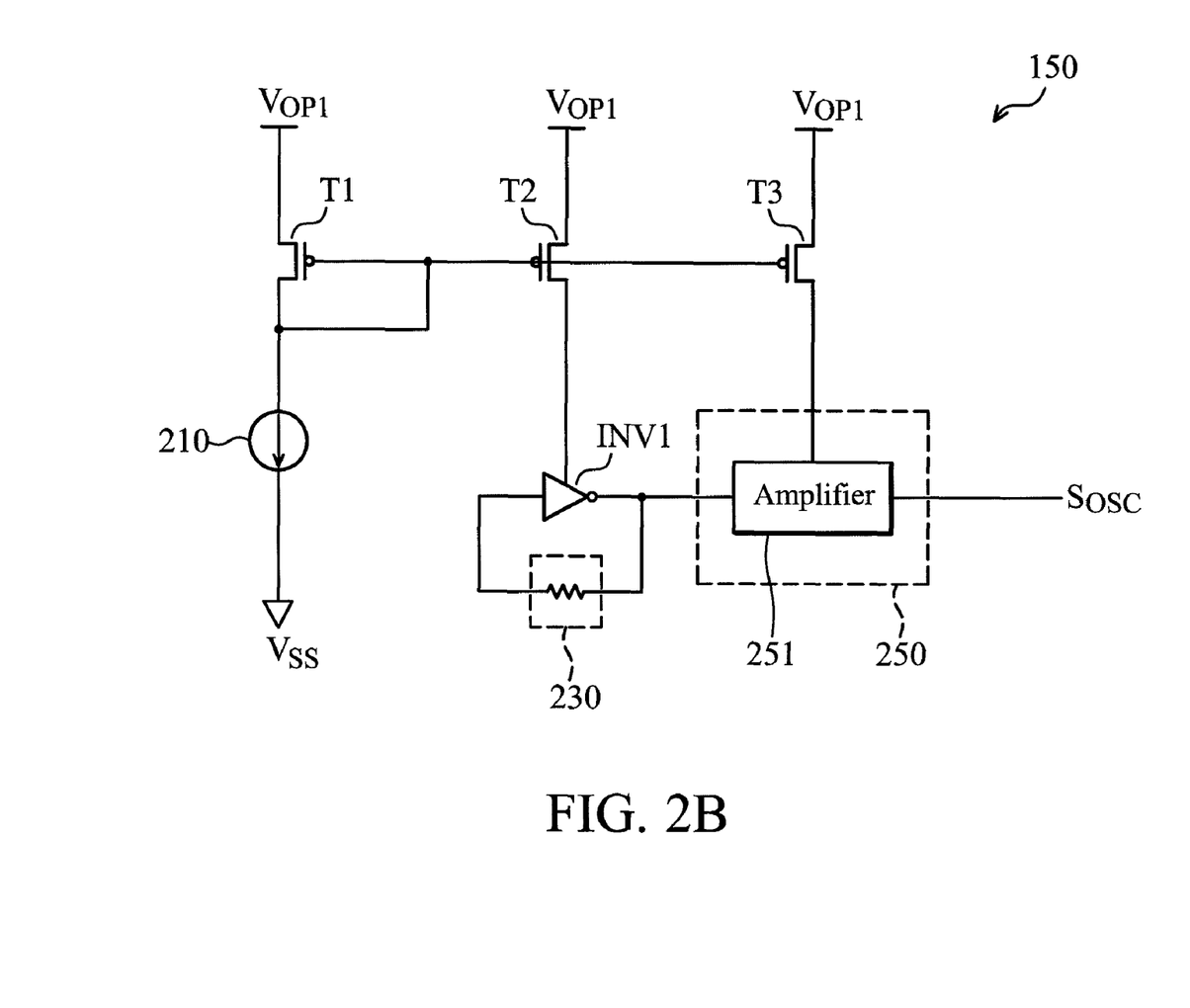
FIGS. 2B~2D are schematic diagrams of other exemplary embodiments of the oscillation circuit.

FIG. 2B is a schematic diagram of another exemplary embodiment of the oscillation circuit. FIG. 2B is similar to FIG. 2A except for the additions of a waveform shaping circuit 250 and a transistor T3. The waveform shaping circuit 250 processes (e.g. amplifies) the output signal of the inverter INV1. The processed result generated by the waveform shaping circuit 250 serves as the oscillation signal $S_{OSC}$. In one embodiment, the waveform shaping circuit 250 amplifies the output signal of the inverter INV1 to transform the output signal of the inverter INV1 from a since wave to square wave.

In this embodiment, the waveform shaping circuit 250 includes an amplifier 251. The amplifier 251 is serially connected to the inverter INV1 for amplifying and inverting the output signal of the inverter INV1. In this embodiment, the output signal of the amplifier 251 serves as the oscillation signal $S_{OSC}$ shown in FIG. 1. Additionally, the power terminal of the amplifier 251 is coupled to the drain of the transistor T3. The source of the transistor T3 receives the operation voltage $V_{OP1}$ and the gate of the transistor T3 is coupled to the gates of the transistors T1 and T2. In this embodiment, the transistors T1~T3 are PMOS transistors.

Figure 2C:
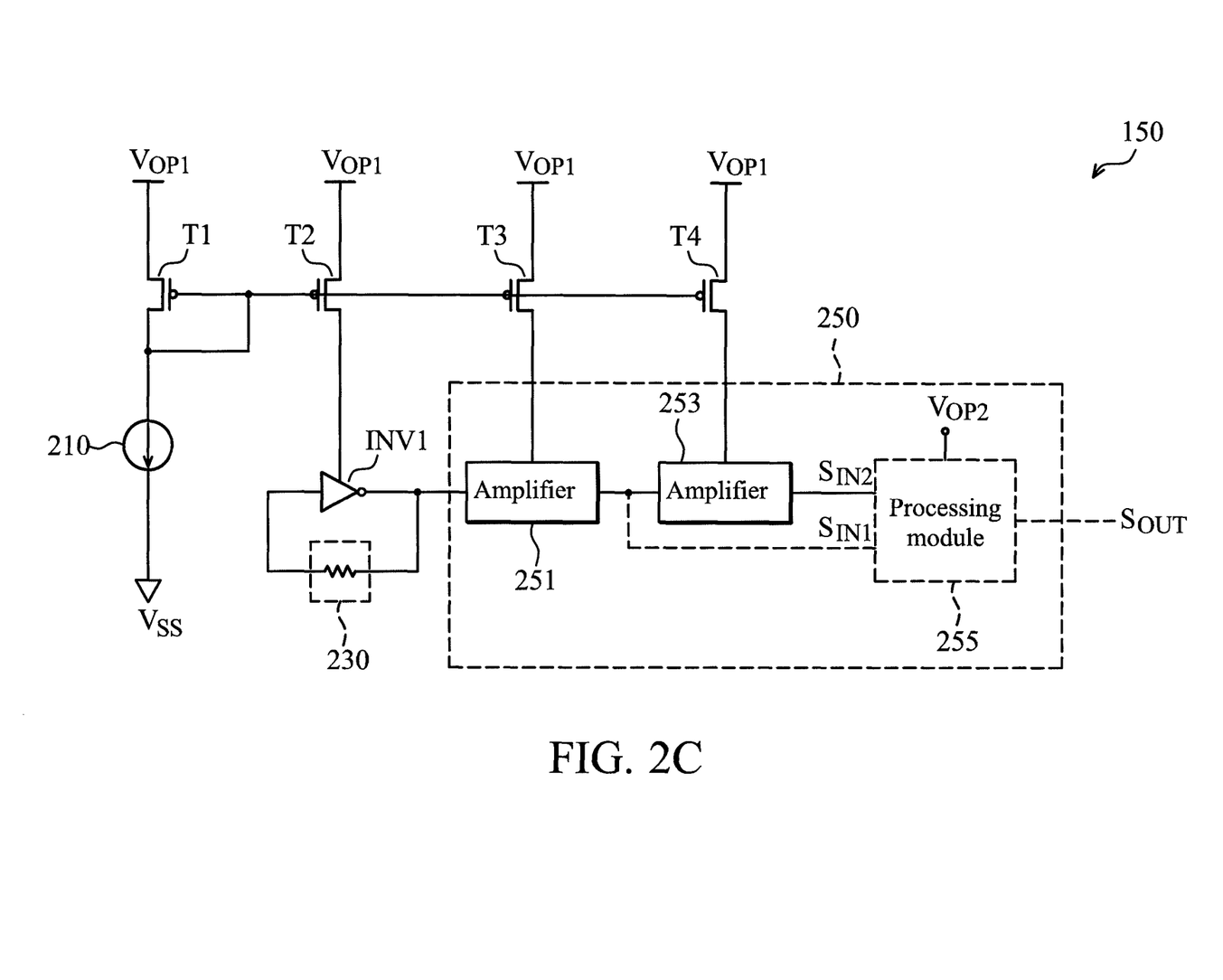

The circuit structure of the waveform shaping circuit 250 is not limited. In one embodiment, the waveform shaping circuit 250 includes a plurality of inverters. FIG. 2C is a schematic diagram of another exemplary embodiment of the oscillation circuit. FIG. 2C is similar to FIG. 2B except for the addition of a transistor T4, an amplifier 253, and a processing module 255.

In this embodiment, the waveform shaping circuit 250 includes the amplifiers 251, 253 and a processing module 255. The amplifier 251 is serially connected to the amplifier 253. Since the functions of the amplifiers 251 and 253 are the same, the description of the amplifier 253 is omitted. Further, the power terminal of the amplifier 253 is coupled to the drain of the transistor T4. Since the connection relation between the transistor T4 and the amplifier 253 is the same as the connection relation between the transistor T3 and the amplifier 251, the connection relation between the transistor T4 and the amplifier 253 is omitted. In this embodiment, the transistor T4 is a PMOS transistor.

Figure 2D:
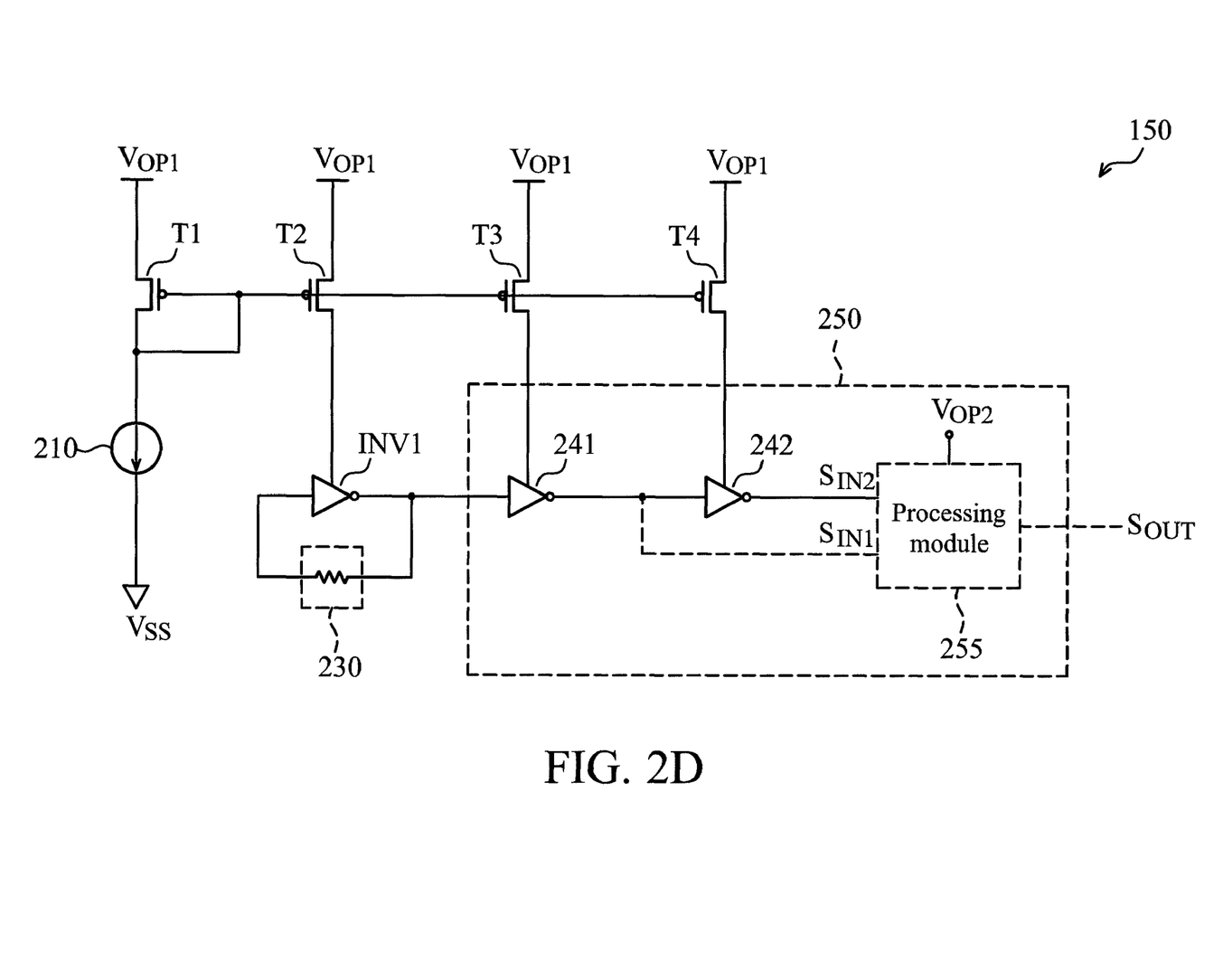

In other embodiments, the waveform shaping circuit 250 includes at least two amplifiers and each amplifier corresponds to one transistor. The corresponding transistor is coupled between the operation voltage $V_{OP1}$ and the power terminal of the corresponding amplifier. In one embodiment, each transistor corresponding to one amplifier is a PMOS transistor. In other embodiments, each amplifier is replaced by one inverter shown in FIG. 2D. FIG. 2D is a schematic diagram of another exemplary embodiment of the oscillation circuit. FIG. 2D is similar to FIG. 2C with the exception that the inverters 241 and 242 shown in FIG. 2D replace the amplifiers 251 and 253 shown in FIG. 2C.

In this embodiment, the waveform shaping circuit 250 further includes the processing module 255. Referring to FIG. 2C, the processing module 255 generates an output signal $S_{OUT}$ includes a square wave. Since the processing module 255 includes a level shift function, the level of the output signal $S_{OUT}$ can be increased. The processing module 255 receives the output $S_{IN1}$ of the amplifier 251 and the output $S_{IN2}$ of the amplifier 253 to generate the output signal $S_{OUT}$. The output signal $S_{OUT}$ serves as the oscillation signal $S_{OSC}$ shown in FIG. 1.

Since the amplifiers 251 and 253 receive the operation voltage $V_{OP1}$) the maximum levels of the outputs $S_{IN1}$ and $S_{IN2}$ are equal to the operation voltage $V_{OP1}$. However, since the processing module 255 receives the operation voltage $V_{OP2}$ and includes a level shift function, the maximum level of the output signal $S_{OUT}$ generated by the processing module 255 is equal to the operation voltage $V_{OP2}$. The operation voltage $V_{OP2}$ is higher than the operation voltage $V_{OP1}$.

Figure 3A:
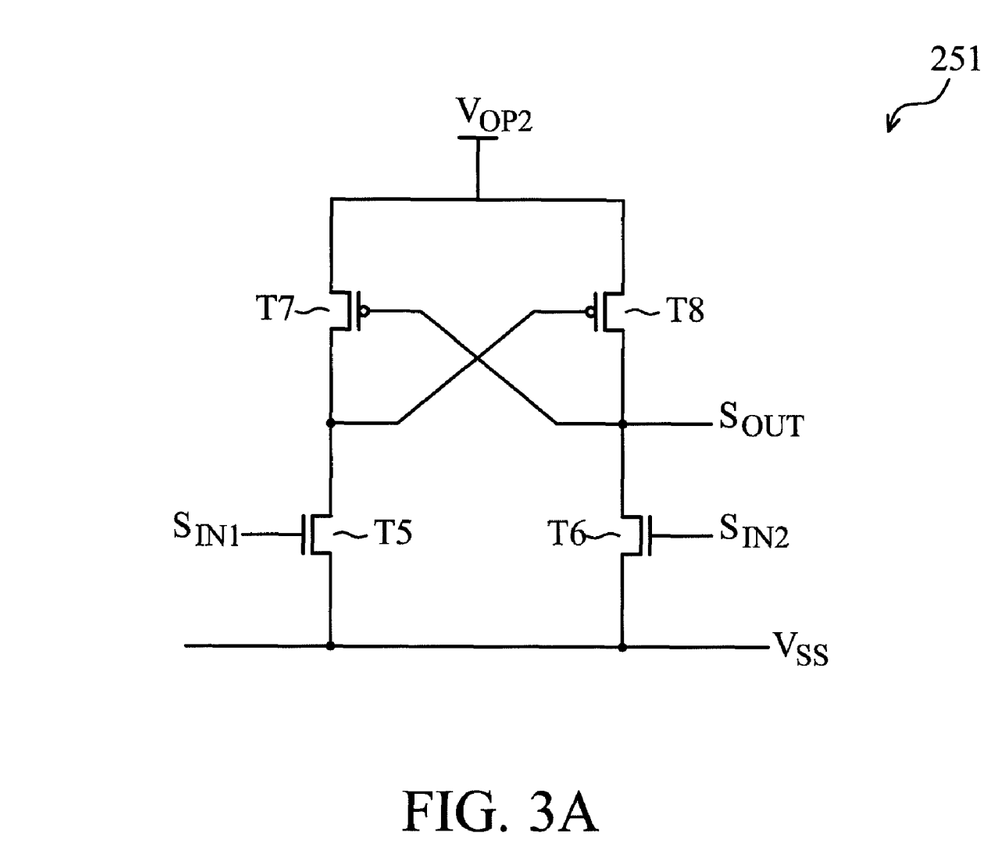
FIG. 3A is a schematic diagram of an exemplary embodiment of a processing module.

FIG. 3A is a schematic diagram of an exemplary embodiment of a processing module. The processing module 255 includes transistors T5~58. In this embodiment, the transistors T5 and T6 are NMOS transistors and the transistors T7 and T8 are PMOS transistors. In other embodiments, the transistors T5 and T6 can be replaced from NMOS transistors to PMOS transistors and the transistors T7 and T8 can be replaced from PMOS transistors to NMOS transistors.

The transistor T5 has a source receiving the grounding voltage $V_{Ss}$, a drain coupled to the gate of the transistor T8 and the drain of the transistor T7, and a gate receiving the output signal $S_{IN1}$ of the amplifier 251. The transistor T6 has a source receiving the grounding voltage $V_{SS}$, a drain coupled to the gate of the transistor T7 and the drain of the transistor T8, and a gate receiving the output signal $S_{IN2}$ of the amplifier 253. The transistor T7 has a source receiving the operation voltage $V_{OP2}$, a drain coupled to the drain of the transistor T5, and a gate coupled to the drain of the transistor T6. The transistor T8 has a source receiving the operation voltage $V_{OP2}$ a drain coupled to the gate of the transistor T7 and the drain of the transistor T6, and a gate coupled to the drain of the transistor T7.

Figure 3B:
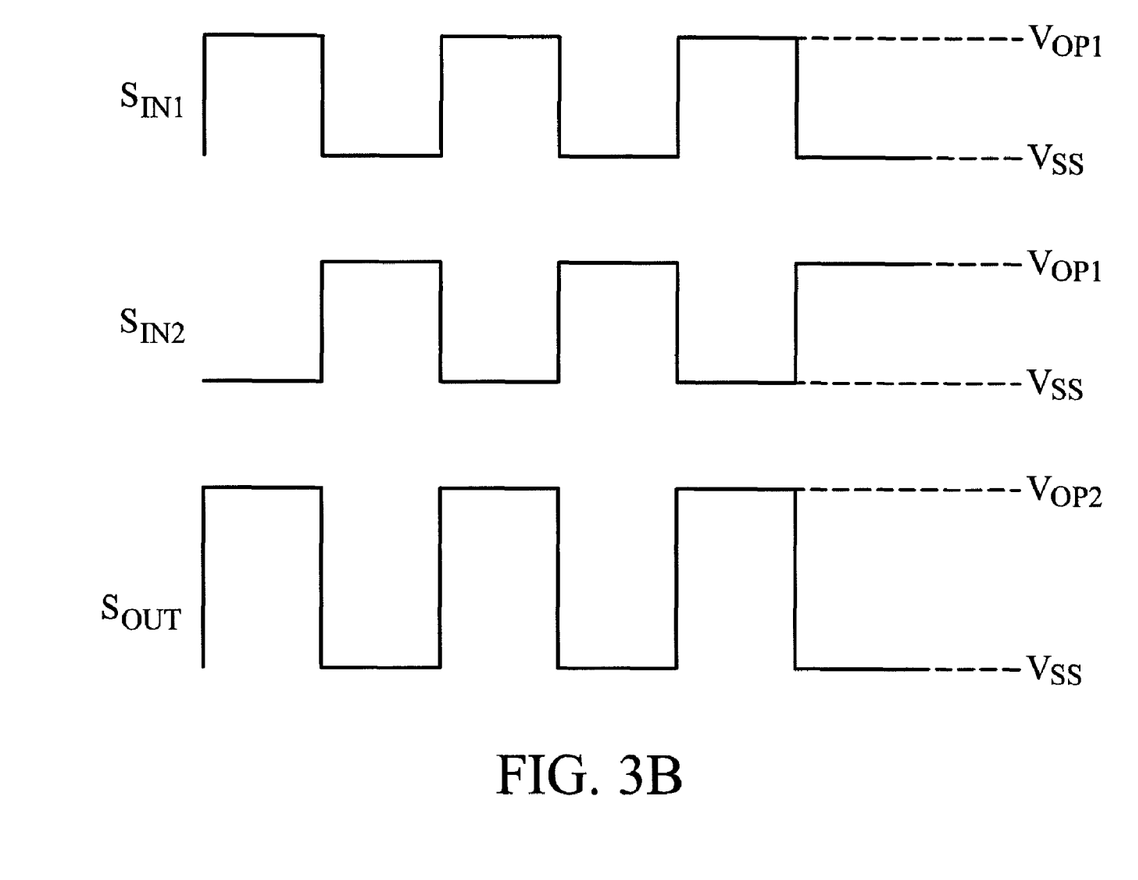
FIG. 3B is a timing chart of the processing module.

FIG. 3B is a timing chart of the processing module 255. Referring to FIGS. 3A and 3B, the output signal $S_{IN1}$ of the amplifier 251 is inverted to the output signal $S_{IN2}$ of the amplifier 253. When the output signal $S_{IN1}$ is at a high level and the output signal $S_{IN2}$ is at a low level, the transistor T5 is turned on and the transistor T6 is turned off. Thus, the transistor T8 is turned on. Since the source of the transistor T8 receives the operation voltage $V_{OP2}$, the output signal $S_{OUT}$ is equal to the operation voltage $V_{OP2}$.

When the output signal $S_{IN1}$ of the amplifier 251 is at the low level and the output signal $S_{IN2}$ of the amplifier 253 is at the high level, the transistor T5 is turned off and the transistor T6 is turned on. Thus, the transistor T7 is turned on and the transistor T8 is turned off. Since the source of the transistor T6 receives the grounding voltage $V_{SS}$, the output signal $S_{OUT}$ is equal to the grounding voltage $V_{SS}$.

Figure 4:
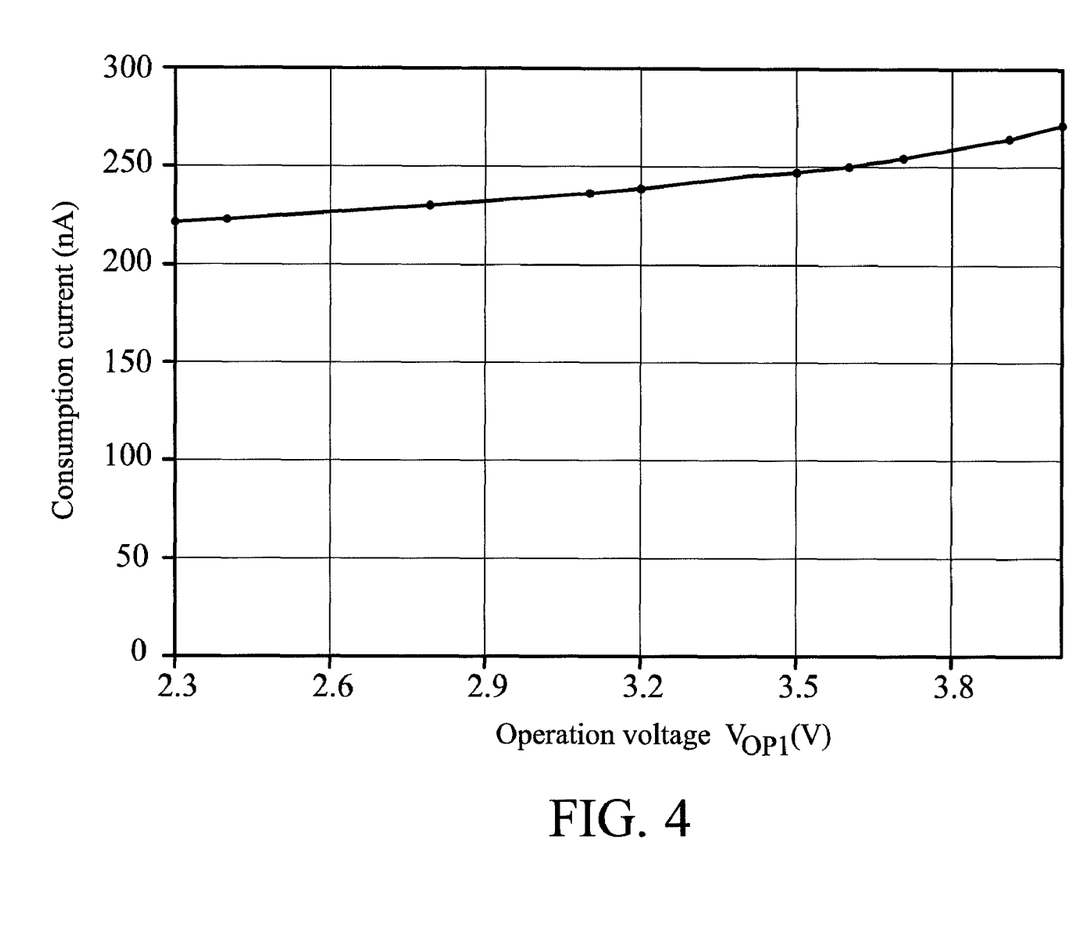
FIG. 4 shows relation between the operation voltage and the consumption current of the oscillation circuit.

FIG. 4 shows relation between the operation voltage and the consumption current of the oscillation circuit. When the operation voltage $V_{OP1}$ is changed, the consumption current of the oscillation circuit is approximately maintained in a control range (e.g. 225 nA~270 nA). Thus, the effect of the variation of the operation voltage $V_{OP1}$ upon the consumption current of the oscillation circuit is degraded. Additionally, since the current consumption of the oscillation circuit is effectively controlled in a fixed range, when the operation voltage $V_{OP1}$ is changed, the power consumption is effectively reduced.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. An oscillation circuit, comprising:
 a first transistor having a first source receiving a first operation voltage, a first drain, and a first gate coupled to the first drain;
 a second transistor having a second source receiving the first operation voltage, a second drain, and a second gate coupled to the first gate;
 a current source coupled between the first drain and a grounding voltage;
 a first inverter generating an oscillation signal and having a first input terminal, a first output terminal, and a first power terminal coupled to the second drain;
 an impedance unit coupled between the first input terminal and the first output terminal; and
 a waveform shaping circuit processing the oscillation signal;
 wherein the waveform shaping circuit includes a first amplifier for amplifying the oscillation signal to generate a first output signal and having a second input terminal coupled to the first output terminal, a second output terminal outputting the first output signal, and a second power terminal;
 wherein the first amplifier includes at least one inverter;
 wherein the oscillation circuit includes a third transistor having a third source receiving the first operation voltage, a third drain coupled to the second power terminal, and a third gate coupled to the second gate.

2. The oscillation circuit as claimed in claim 1,
 wherein the waveform shaping circuit includes a second amplifier for amplifying the first output signal to generate a second output signal and having a third input terminal coupled to the second output terminal, a third output terminal outputting the second output signal, a third power terminal, and a second inverter; and
 wherein the impedance unit is a resistor.

3. The oscillation circuit as claimed in claim 2, further comprising:
 a fourth transistor having a fourth source receiving the first operation voltage, a fourth drain coupled to the third power terminal, and a fourth gate coupled to the third gate;
 wherein each of the first, the second, the third, and the fourth transistors is a P-type transistor;
 wherein the waveform shaping circuit includes a processing module for receiving the first and the second output signals to generate a third output signal;
 wherein the third output signal includes a square wave and serves as the oscillation signal;
 wherein the processing module receives a second operation voltage higher than the first operation voltage and the amplitude of the third output signal relates to the second operation voltage.

4. The oscillation circuit as claimed in claim 3, wherein the processing module includes:
 a fifth transistor having a fifth source receiving the grounding voltage, a fifth drain, and a fifth gate receiving the first output signal;
 a sixth transistor having a sixth source receiving the grounding voltage, a sixth drain, and a sixth gate receiving the second output signal;
 a seventh transistor having a seventh source receiving the second operation voltage, a seventh drain coupled to the fifth drain, and a seventh gate; and
 an eighth transistor having an eighth source receiving the second operation voltage, an eighth drain coupled to the seventh gate and the sixth drain, and an eighth gate coupled to the seventh source, wherein the eighth drain generates the third output signal;
 wherein each of the first, the second, the third, the fourth, the seventh, and the eighth transistors is a P-type transistor and each of the fifth and the sixth transistors is an N-type transistor.

5. A timing device, comprising:
 a logic circuit for counting the pulse amount of an oscillation signal and updating time of a real time clock (RTC) according to the counting result;
 an oscillation circuit coupled to the logic circuit, wherein the oscillation circuit includes a first transistor having a first source receiving a first operation voltage, a first drain, and a first gate coupled to the first drain; a second transistor having a second source receiving the first operation voltage, a second drain, and a second gate coupled to the first gate; a current source coupled between the first drain and a grounding voltage; a first inverter generating the oscillation signal and having a first input terminal, a first output terminal, and a first power terminal coupled to the second drain; and an impedance unit coupled between the first input terminal and the first output terminal; and
 a waveform shaping circuit for processing the oscillation signal;
 wherein the waveform shaping circuit includes a first amplifier for amplifying the oscillation signal to generate a first output signal and having a second input terminal coupled to the first output terminal, a second output terminal outputting the first output signal, and a second power terminal;
 wherein the first amplifier includes one or more inverters;
 wherein the impedance unit is a resistor; and
 wherein the waveform shaping circuit includes a third transistor having a third source receiving the first operation voltage, a third drain coupled to the second power terminal, and a third gate coupled to the second gate.

6. The timing device as claimed in claim 5,
wherein the waveform shaping circuit includes a second amplifier for amplifying the first output signal to generate a second output signal and having a third input terminal coupled to the second output terminal, a third output terminal outputting the second output signal, a third power terminal, and a second inverter.

7. The timing device as claimed in claim 6, further comprising:
a fourth transistor having a fourth source receiving the first operation voltage, a fourth drain coupled to the third power terminal, and a fourth gate coupled to the third gate;
wherein each of the first, the second, the third, and the fourth transistors is a P-type transistor;
wherein the waveform shaping circuit includes a processing module for receiving the first and the second output signals to generate a third output signal;
wherein the third output signal includes a square wave and serves as the oscillation signal;
wherein the processing module receives a second operation voltage higher than the first operation voltage and the amplitude of the third output signal relates to the second operation voltage.

8. The timing device as claimed in claim 7, wherein the processing module comprises:
a fifth transistor having a fifth source receiving the grounding voltage, a fifth drain, and a fifth gate receiving the first output signal;
a sixth transistor having a sixth source receiving the grounding voltage, a sixth drain, and a sixth gate receiving the second output signal;
a seventh transistor having a seventh source receiving the second operation voltage, a seventh drain coupled to the fifth drain, and a seventh gate; and
an eighth transistor having an eighth source receiving the second operation voltage, an eighth drain coupled to the seventh gate and the sixth drain, and an eighth gate coupled to the seventh source, wherein the eighth drain generates the third output signal;
wherein each of the first, the second, the third, the fourth, the seventh, and the eighth transistors is a P-type transistor and each of the fifth and the sixth transistors is an N-type transistor.

9. The timing device as claimed in claim 5, wherein the logic circuit comprises:
a first divider for processing the oscillation to generate a first processed signal; and
a second divider for processing the first processed signal to generate a second processed signal;
wherein the pulse amount of the first processed signal is a half of the pulse amount of the oscillation signal and the pulse amount of the second processed signal is a half of the pulse amount of the first processed signal.

10. An electronic system, comprising:
a real time clock; and
a timing device for controlling the real time clock, wherein the timing device includes a logic circuit and an oscillation circuit;
wherein the logic circuit counts the pulse amount of an oscillation signal and updating the time of the real time clock according to the counting result;
wherein the oscillation circuit includes:
a first transistor having a first source receiving a first operation voltage, a first drain, and a first gate coupled to the first drain;
a second transistor having a second source receiving the first operation voltage, a second drain, and a second gate coupled to the first gate;
a current source coupled between the first drain and a grounding voltage;
a first inverter generating the oscillation signal and having a first input terminal, a first output terminal, and a first power terminal coupled to the second drain;
an impedance unit coupled between the first input terminal and the first output terminal; and
a waveform shaping circuit processing the oscillation signal;
wherein the waveform shaping circuit includes a first amplifier for amplifying the oscillation signal to generate a first output signal and having a second input terminal coupled to the first output terminal, a second output terminal outputting the first output signal, and a second power terminal;
wherein the first amplifier includes at least one inverter; and
wherein the impedance unit is a resistor;
wherein the waveform shaping circuit further includes a third transistor having a third source receiving the first operation voltage, a third drain coupled to the second power terminal, and a third gate coupled to the second gate.

11. The electronic system as claimed in claim 10,
wherein the waveform shaping circuit includes a second amplifier for amplifying the first output signal to generate a second output signal and having a third input terminal coupled to the second output terminal, a third output terminal outputting the second output signal, a third power terminal, and a second inverter.

12. The electronic system as claimed in claim 11, further comprising:
a fourth transistor having a fourth source receiving the first operation voltage, a fourth drain coupled to the third power terminal, and a fourth gate coupled to the third gate;
wherein each of the first, the second, the third, and the fourth transistors is a P-type transistor;
wherein the waveform shaping circuit further comprises:
a processing module receiving the first and the second output signals to generate a third output signal;
wherein the third output signal includes a square wave and serves as the oscillation signal; and
wherein the processing module receives a second operation voltage higher than the first operation voltage and the amplitude of the third output signal relates to the second operation voltage.

13. The electronic system as claimed in claim 12, wherein the processing module comprises:
a fifth transistor having a fifth source receiving the grounding voltage, a fifth drain, and a fifth gate receiving the first output signal;
a sixth transistor having a sixth source receiving the grounding voltage, a sixth drain, and a sixth gate receiving the second output signal;
a seventh transistor having a seventh source receiving the second operation voltage, a seventh drain coupled to the fifth drain, and a seventh gate; and
an eighth transistor having an eighth source receiving the second operation voltage, an eighth drain coupled to the seventh gate and the sixth drain, and an eighth gate coupled to the seventh source, wherein the eighth drain generates the third output signal.

14. The electronic system as claimed in claim 13, wherein each of the first, the second, the third, the fourth, the seventh, and the eighth transistors is a P-type transistor and each of the fifth and the sixth transistors is an N-type transistor.

15. The electronic system as claimed in claim 10, wherein the logic circuit comprises:
- a first divider processing the oscillation to generate a first processed signal; and
- a second divider processing the first processed signal to generate a second processed signal.

16. The electronic system as claimed in claim 15, wherein the pulse amount of the first processed signal is a half of the pulse amount of the oscillation signal and the pulse amount of the second processed signal is a half of the pulse amount of the first processed signal;
wherein the pulse amount of the second processed signal determines the time of the real time clock.

* * * * *